United States Patent
Fujii et al.

(10) Patent No.: US 12,054,190 B2
(45) Date of Patent: Aug. 6, 2024

(54) DETECTION MECHANISM

(71) Applicant: KABUSHIKI KAISHA TOKAI-RIKA-DENKI-SEISAKUSHO, Aichi-ken (JP)

(72) Inventors: Takahiro Fujii, Aichi (JP); Hiroshi Ohira, Aichi (JP); Yasumasa Kondo, Aichi (JP); Hiroshi Takeoka, Aichi (JP)

(73) Assignee: KABUSHIKI KAISHA TOKAI-RIKA-DENKI-SEISAKUSHO, Aichi (JP)

(*) Notice: Subject to any disclaimer, the term of this patent is extended or adjusted under 35 U.S.C. 154(b) by 166 days.

(21) Appl. No.: 17/946,659

(22) Filed: Sep. 16, 2022

(65) Prior Publication Data
US 2023/0097013 A1 Mar. 30, 2023

(30) Foreign Application Priority Data
Sep. 27, 2021 (JP) .................. 2021-157278

(51) Int. Cl.
*B62D 1/06* (2006.01)
*G01V 3/08* (2006.01)

(52) U.S. Cl.
CPC ............... *B62D 1/06* (2013.01); *G01V 3/088* (2013.01)

(58) Field of Classification Search
CPC .......... B62D 1/06; B62D 1/046; G01V 3/088; G01V 3/02; H03K 2017/9606; H03K 2217/960755; H03K 17/962; H03K 2217/960765
See application file for complete search history.

(56) References Cited

U.S. PATENT DOCUMENTS

| | | | |
|---|---|---|---|
| 2018/0354543 A1* | 12/2018 | Nishio | B62D 1/065 |
| 2019/0025824 A1* | 1/2019 | Odate | B62D 1/046 |
| 2019/0210629 A1* | 7/2019 | Kwon | G06F 3/0448 |
| 2021/0206418 A1* | 7/2021 | Nakano | G01V 3/088 |
| 2021/0276604 A1* | 9/2021 | Kondo | B60R 16/02 |

FOREIGN PATENT DOCUMENTS

JP 2021-018692 2/2021

* cited by examiner

*Primary Examiner* — Alvaro E Fortich
(74) *Attorney, Agent, or Firm* — Dority & Manning, P.A.

(57) ABSTRACT

A sensor electrode and an insulating body are coupled together by a hot melt member in a sensor of a steering wheel. The sensor electrode makes contact with the insulating body at first protrusions so as to form through holes in the hot melt member. The hot melt member is accordingly able to stretch easily due to the through holes, enabling a high extensibility for the sensor to be achieved.

10 Claims, 6 Drawing Sheets

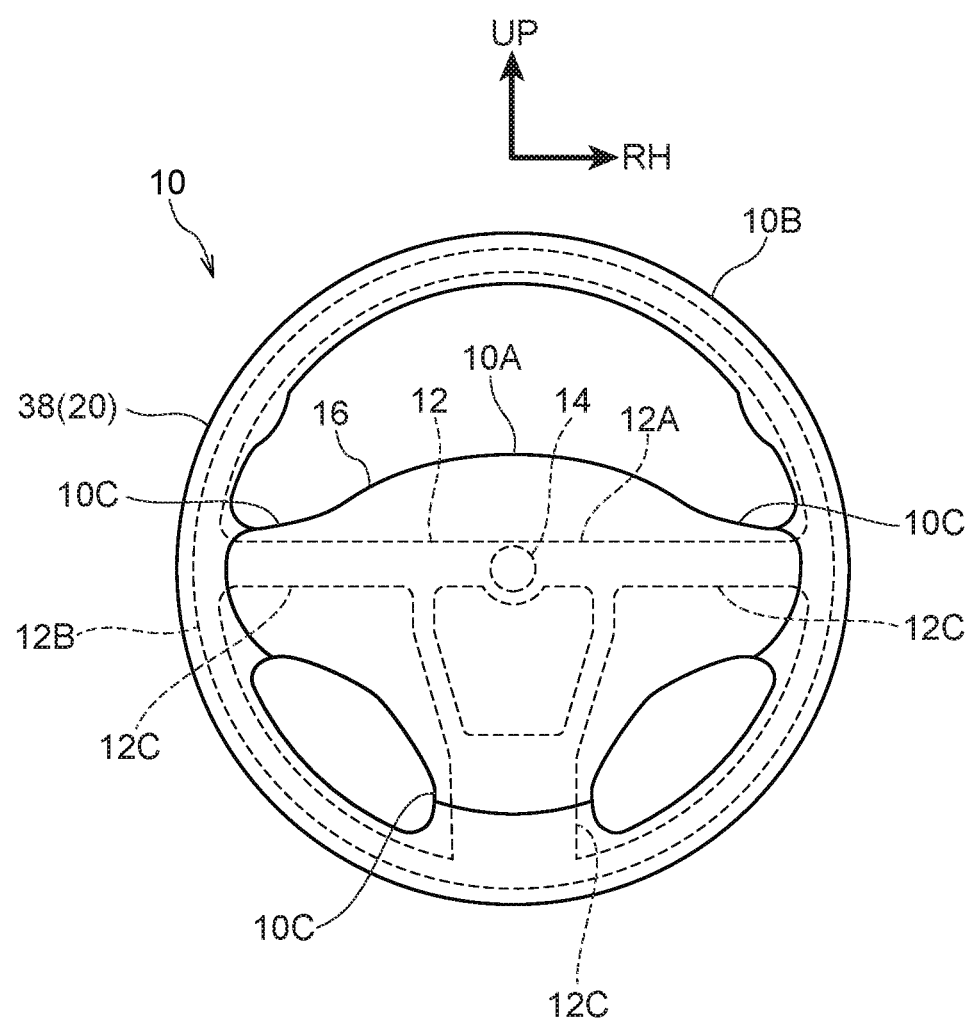

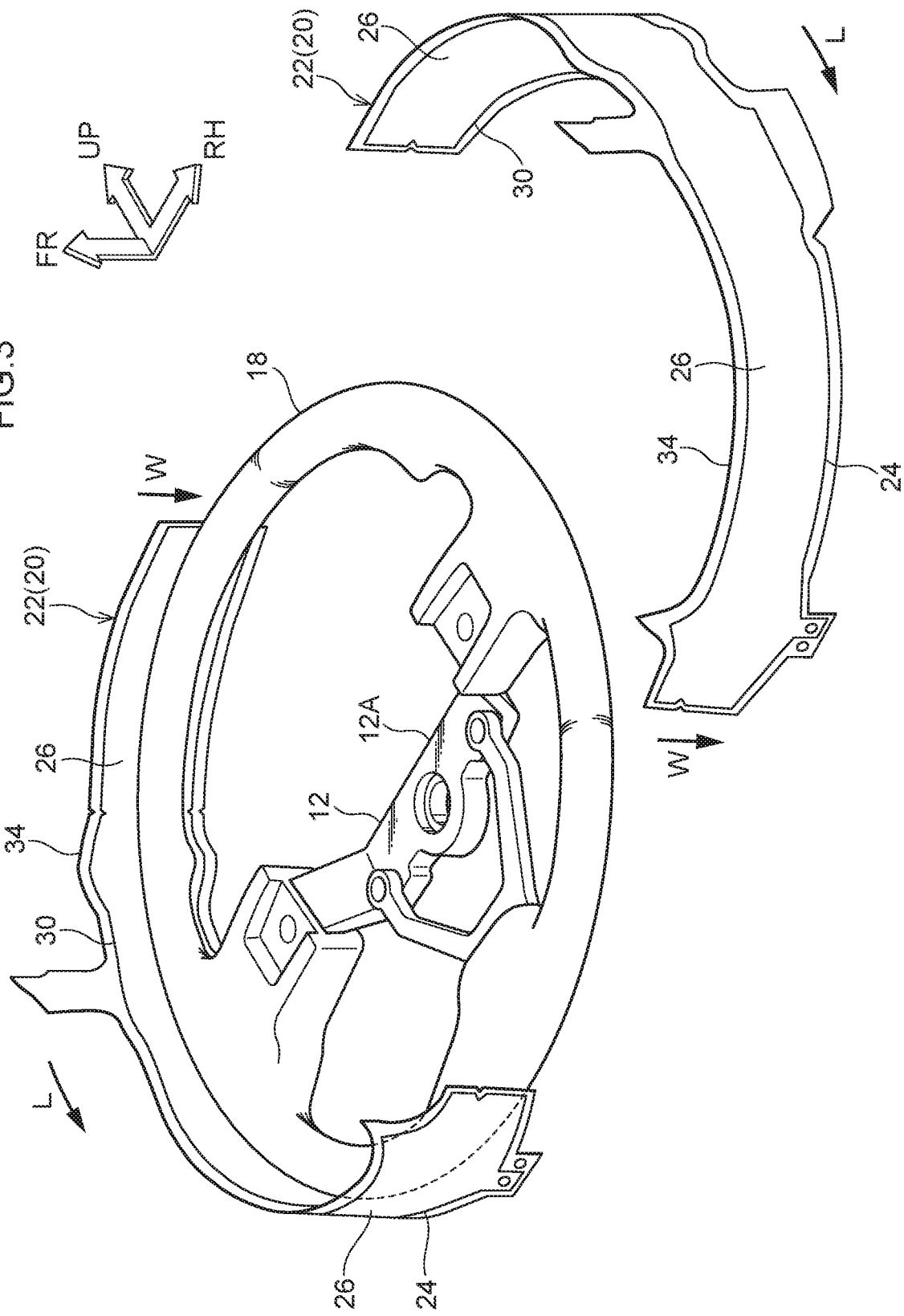

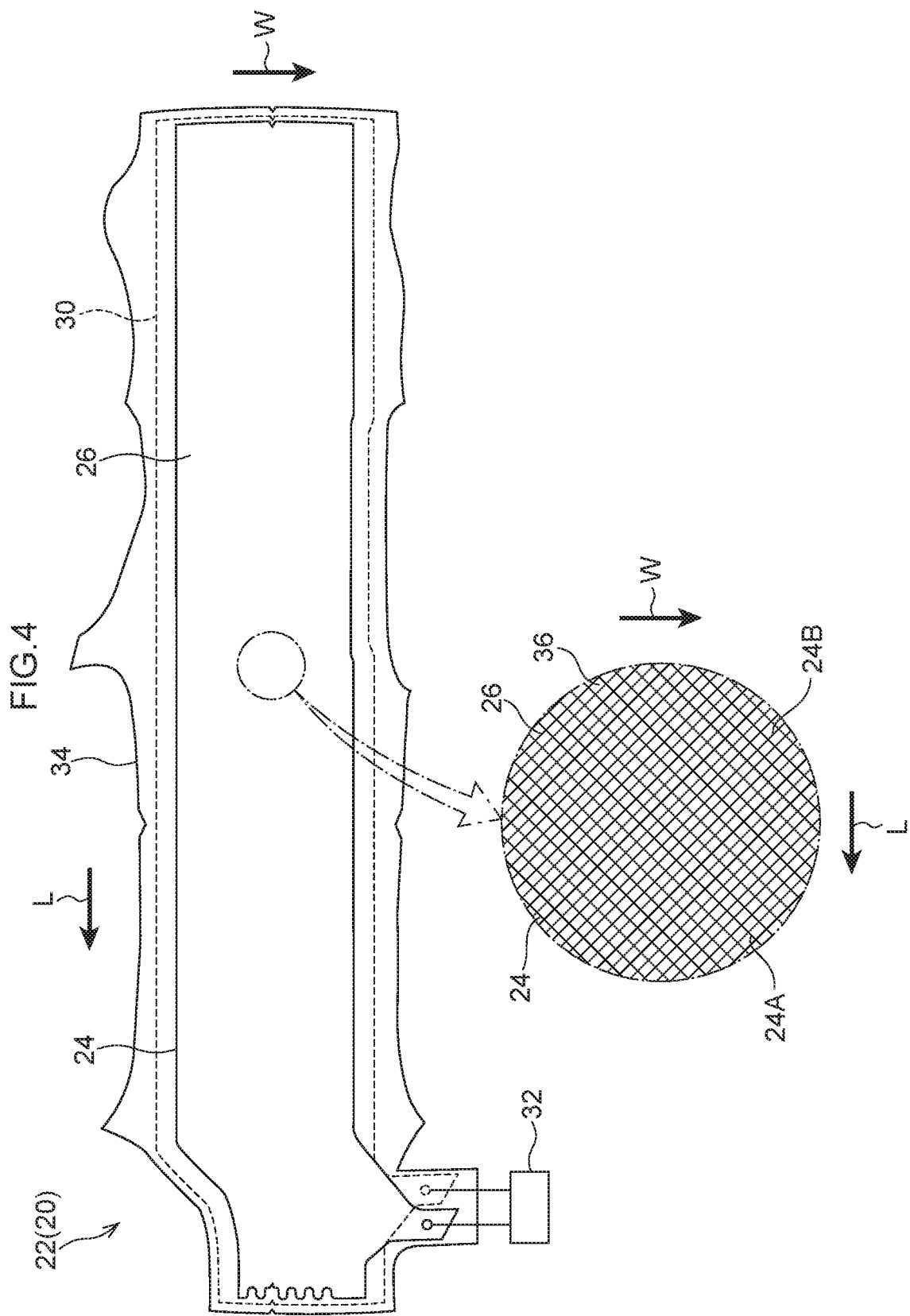

DETECTION MECHANISM

CROSS-REFERENCE TO RELATED APPLICATION

This application is based on and claims priority under 35 USC 119 from Japanese Patent Application No. 2021-157278 filed on Sep. 27, 2021, the disclosure of which is incorporated by reference herein.

BACKGROUND

Technical Field

The present invention relates to a detection mechanism configured to detect contact of a person with a contact body.

Related Art

An electrostatic capacitance sensor described in Japanese Patent Application Laid-Open (JP-A) No. 2021-18692 is provided at a rim of a steering wheel of a vehicle. The electrostatic capacitance sensor includes a sensor electrode adhered to a front-face side of a foam sheet, with a ground electrode sewn to the back-face side of the foam sheet.

In the electrostatic capacitance sensor, the sensor electrode is adhered to the foam sheet using an adhesive.

SUMMARY

In consideration of the above circumstances, an object of the present invention is to obtain a detection mechanism capable of raising extensibility of a detection section.

A detection mechanism of a first aspect of the present invention includes: a detection section provided at a contact body and configured to detect contact of a person with the contact body; a conducting body provided at the detection section; an insulating body provided at the detection section; a coupling member provided at the detection section between the conducting body and the insulating body and solidified so as to couple the conducting body and the insulating body together; and a protrusion provided at at least one of the conducting body or the insulating body, the conducting body and the insulating body making contact at an installation position of the protrusion so as to form a through hole in the coupling member.

In the detection mechanism of the first aspect of the present invention, the detection section of the contact body detects contact of a person with the contact body. The coupling member is provided at the detection section between the conducting body and the insulating body and solidified so as to couple the conducting body and the insulating body together.

The protrusion is provided at at least one of the conducting body or the insulating body, with the conducting body and the insulating body making contact at the installation position of the protrusion so as to form a through hole in the coupling member. The coupling member is accordingly easily extended due to the presence of the through hole, enabling a high extensibility of the detection section to be achieved.

A detection mechanism of a second aspect of the present invention is the detection mechanism of the first aspect of the present invention, wherein a protrusion provided at the conducting body and a protrusion provided at the insulating body make contact with each other.

In the detection mechanism of a second aspect of the present invention, the protrusion of the conducting body and the protrusion of the insulating body make contact with each other. This thereby enables the through hole to be formed in the coupling member appropriately.

A detection mechanism of a third aspect of the present invention includes: a detection section provided at a contact body and configured to detect contact of a person with the contact body; a conducting body provided at the detection section and having a cloth form woven from a first thread and a second thread; an insulating body provided at the detection section; and a coupling member provided at the detection section between the conducting body and the insulating body, solidified so as to couple the conducting body and the insulating body together, and not provided at a contact portion between the first thread and the second thread.

In the detection mechanism of the third aspect of the present invention, the detection section of the contact body detects contact of a person with the contact body. The coupling member is provided at the detection section between the conducting body and the insulating body, and the coupling member is solidified so as to couple the conducting body and the insulating body together. The conducting body furthermore has the cloth form woven from the first thread and the second thread.

The coupling member is not provided at the contact portion between the first thread and the second thread of the conducting body. This accordingly enables limitation of relative tilting at the contact portion between the first thread and the second thread to be suppressed from occurring and limitation of extension of the conducting body to be suppressed from occurring, enabling a high extensibility of the detection section to be achieved.

A detection mechanism of a fourth aspect of the present invention is the detection mechanism of any one of the first aspect to the third aspect of the present invention, wherein the conducting body is provided at the detection section only on one side of the insulating body.

In the detection mechanism of the fourth aspect of the present invention, the conducting body is provided at the detection section only on one side of the insulating body. This enables a different and raised extensibility of the detection section compared to cases in which the conducting body is provided in the detection section on both one side and the other side of the insulating body.

BRIEF DESCRIPTION OF THE DRAWINGS

Exemplary embodiments of the present invention will be described in detail based on the following figures, wherein:

FIG. 1 is a face-on view illustrating a steering wheel according to a first exemplary embodiment of the present invention viewed from a front side thereof;

FIG. 3 is an exploded perspective view illustrating relevant portions of the steering wheel according to the first exemplary embodiment of the present invention viewed from a front side thereof;

FIG. 4 is a development drawing illustrating a sensor of the steering wheel according to the first exemplary embodiment of the present invention viewed from a front-face side thereof;

DETAILED DESCRIPTION

First Exemplary Embodiment

Figure 2A:
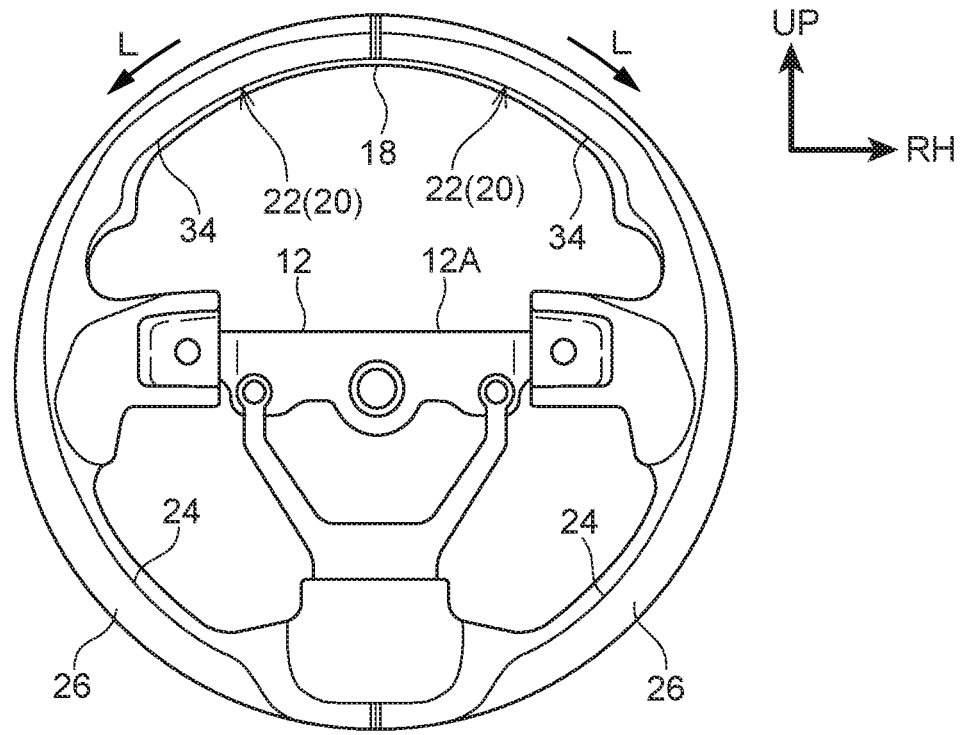
FIG. 2A is a face-on view illustrating relevant portions of the steering wheel according to the first exemplary embodiment of the present invention viewed from a front side thereof.
Figure 2B:
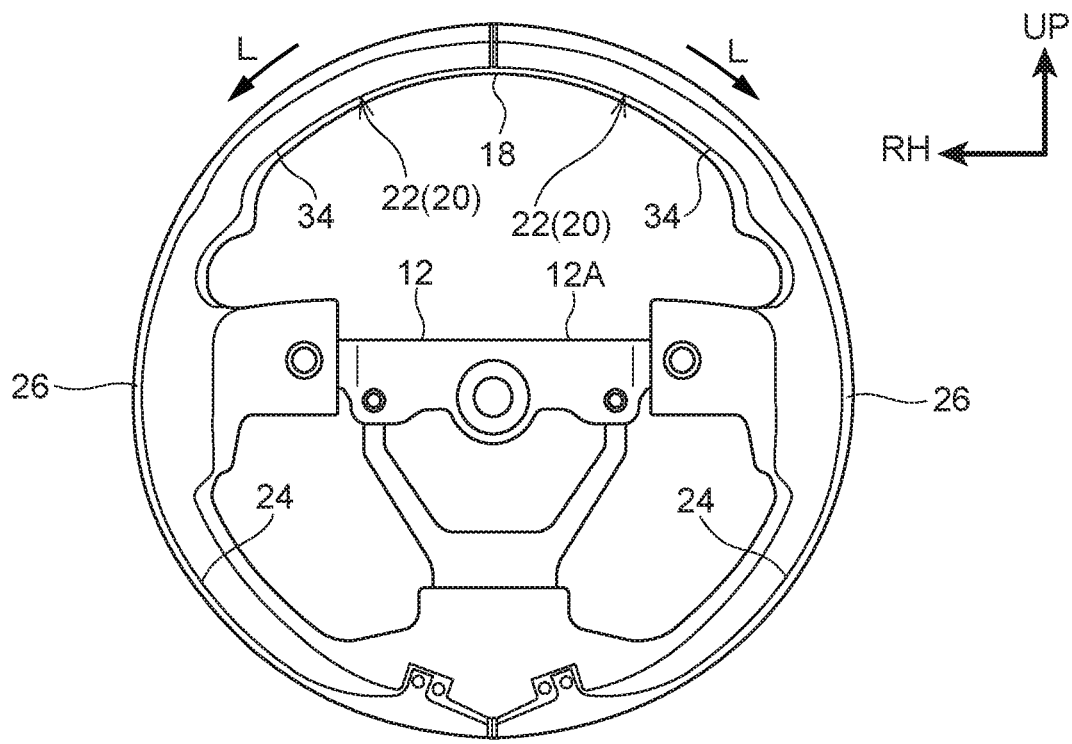
FIG. 2B is a rear-face view illustrating relevant portions of the steering wheel according to the first exemplary embodiment of the present invention viewed from a rear side thereof.

FIG. 1 is a face-on view illustrating a steering wheel 10 serving as a contact body according to a first exemplary embodiment of the present invention viewed from a front side thereof. Note that in the drawings an arrow FR indicates a front side of the steering wheel 10, an arrow RH indicates a right side of the steering wheel 10, and an arrow UP indicates an upper side of the steering wheel 10.

The steering wheel 10 according to the present exemplary embodiment faces toward a driver seat of a vehicle at a vehicle rear side of the steering wheel 10, with the steering wheel 10 disposed at a vehicle front side of an occupant (driver, contact person) seated in the driver seat. The front side, right side, and upper side of the steering wheel 10 face respectively toward the rear side, the right side, and the upper side of the vehicle.

As illustrated in FIG. 1, a boss section 10A is provided as a fixed section at a central portion of the steering wheel 10, and a rim section 10B having a circular ring shape in face-on view is provided as a contact section at an outer peripheral portion of the steering wheel 10. Three spokes 10C are provided as connection sections between the boss section 10A and the rim section 10B. The spokes 10C extend from the boss section 10A toward the left side, right side, and lower side, and are connected to the boss section 10A and to the rim section 10B.

A core 12 made from metal is provided to the steering wheel 10 as a framework member.

A plate shaped boss core 12A is provided at a central portion of the core 12, with the boss core 12A configuring the boss section 10A. The boss core 12A is fixed to a vehicle rear side end (vehicle upper side end) of a circular column shaped steering shaft 14 serving as a support shaft in the vehicle, and the steering shaft 14 is arranged so as to be coaxial to the rim section 10B. The steering wheel 10 (core 12) is supported by the steering shaft 14 so as to be able to rotate integrally therewith. The steering shaft 14 is rotated about its central axis line and the vehicle is steered by the occupant gripping the rim section 10B and performing a rotation operation on the steering wheel 10 in the circumferential direction thereof.

A rim core 12B having a circular ring shape in face-on view is provided at an outer peripheral portion of the core 12, with the rim core 12B configuring the rim section 10B. Three elongated plate shaped spoke cores 12C are provided between the boss core 12A and the rim core 12B, with the spoke cores 12C extending from the boss core 12A to the left side, right side, and lower side (the radial direction outside of the steering wheel 10), and with the spoke cores 12C being integrally connected to both the boss core 12A and the rim core 12B and configuring the spokes 10C.

A plate shaped pad 16 is provided as a covering member to the boss section 10A and the spokes 10C. The pad 16 is attached to the front side of the boss core 12A and the spoke cores 12C, with the pad 16 covering the front side of the boss core 12A and the spoke cores 12C.

An inner member 18 (see FIG. 3) having a circular ring shape in face-on view and serving as an installation member is provided along an entire length direction of the rim section 10B (i.e. the circumferential direction of the steering wheel 10) and an entire peripheral direction (a direction of rotation about the length direction) of the rim section 10B, with the inner member 18 made from a soft resin (polyurethane, for example) and having a circular shaped external profile in a cross-section perpendicular to the length direction. The rim core 12B is housed inside the inner member 18, and the inner member 18 is fixed to the rim core 12B.

Elongated substantially rectangular sheet shaped sensors 22 (see FIG. 2A, FIG. 2B, FIG. 3, and FIG. 4) are respectively provided at a left side portion and a right side portion of the rim section 10B and serve as detection sections respectively configuring a detection mechanism 20. The sensors 22 are each stuck to the outer periphery of the inner member 18. A length direction of the sensors 22 is disposed so as to curve along the length direction of the rim section 10B, with a length direction one side of each of the sensors 22 (a direction of arrow L of FIG. 4) facing a length direction lower side of the rim section 10B. A width direction of the sensors 22 is disposed so as to curve along the peripheral direction of the rim section 10B, with a width direction one side of the sensors 22 (a direction of arrow W of FIG. 4) facing a peripheral direction rear side of the rim section 10B. The width direction center of the sensors 22 is disposed at the steering wheel 10 radial direction outside of the rim section 10B, with the two width direction edges of the sensors 22 being disposed at the steering wheel 10 radial direction inside of the rim section 10B.

A sensor electrode 24 having an elongated substantially rectangular cloth form is provided as a conducting body (sensor section) at front-face side portions of each of the sensors 22 (radial direction outside portions of the rim section 10B), with the length direction one side and the width direction one side of the sensor electrodes 24 respectively facing in the same direction as the length direction one side and the width direction one side of the sensors 22.

Figure 5A:
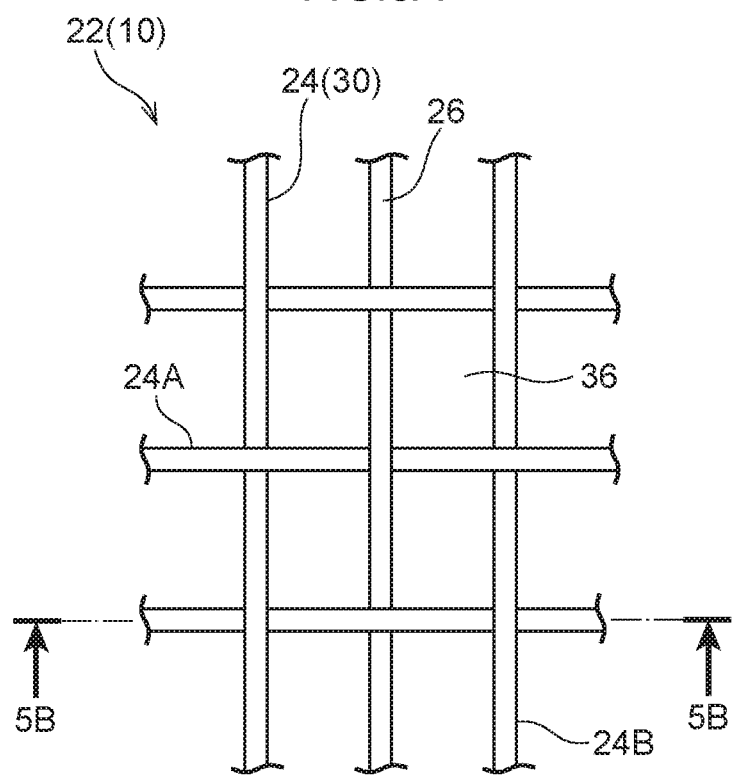
FIG. 5A is an enlarged development drawing illustrating the sensor of the steering wheel according to the first exemplary embodiment of the present invention.
Figure 5B:
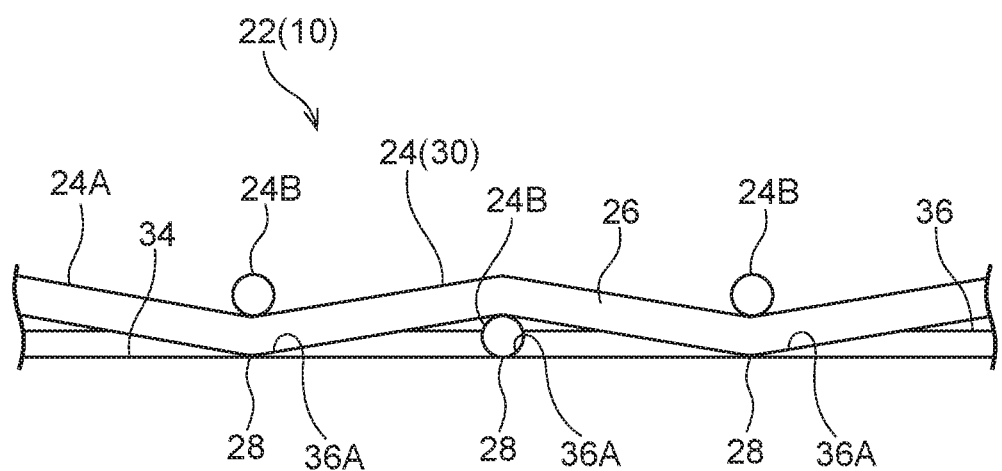
FIG. 5B is an enlarged cross-section illustrating the sensor of the steering wheel according to the first exemplary embodiment of the present invention (a cross-section taken on line 5B-5B of FIG. 5A)

The sensor electrodes 24 (see FIG. 5A and FIG. 5B) each have a cloth form woven from resin first threads 24A (one of a warp or a weft) and resin second threads 24B (the other of the warp or weft), with both the first threads 24A and the second threads 24B being configured from the same twisted yarn. The first thread 24A are inclined in a direction toward the width direction one side of the sensor electrode 24 on progression toward the length direction one side of the sensor electrode 24. The second thread 24B are inclined in a direction toward the width direction one side of the sensor electrode 24 on progression toward the length direction other side of the sensor electrode 24, with the first threads 24A and the second threads 24B having, for example, an inclination angle of 45° with respect to the length direction and width direction of the sensor electrode 24.

Metal plating 26 is formed over the entire outer periphery of the first thread 24A and the second thread 24B after the first threads 24A and the second threads 24B of the sensor electrode 24 have been woven. The sensor electrode 24 accordingly exhibits conductivity due to the metal plating 26, with conduction occurring at intersection points between the first threads 24A and the second threads 24B due to the presence of the metal plating 26. In the sensor electrode 24, first protrusions 28 (see FIG. 5B) having a substantially V-shaped cross-section are formed as protrusions at the intersecting portions between the first thread 24A and the second thread 24B. The first protrusions 28 are formed by either the first thread 24A or the second thread 24B being disposed at the back-face side (rim section 10B radial direction inside) of the sensor 22 at the intersection points between the first thread 24A and the second thread 24B, with the first protrusions 28 projecting toward the back-face side of the sensor 22.

The sensor electrode 24 is not extensible either in the extension direction of the first thread 24A or in the extension direction of the second thread 24B, but is extensible in directions other than the extension direction of the first threads 24A and the extension direction of the second threads 24B, with the sensor electrode 24 being extended in the length direction when being assembled to the rim section 10B. This means that the first threads 24A and the second threads 24B are tilted in opposite directions to each other, such that the angles of inclination of the first threads 24A and the second threads 24B with respect to the length direction of the sensor electrode 24 are decreased.

A cancel electrode 30 having an elongated substantially rectangular cloth form is provided as a conducting body (cancel section) at hack-face side portions of each of the sensors 22 (radial direction inside portions of the rim section 10B), with the cancel electrodes 30 having substantially the same configuration as the sensor electrodes 24. The first protrusions 28 (see FIG. 5B) are formed in the cancel electrode 30 at intersecting portions between the first threads 24A and the second threads 24B, the first protrusions 28 are formed by either the first threads 24A or the second threads 24B being disposed at the sensor 22 front-face side (rim section 10B radial direction outside) at the intersection points between the first threads 24A and the second threads 24B, with the first protrusions 28 projecting toward the front-face side of the sensor 22.

A length direction one side and width direction one side end portion of each of the sensor electrodes 24 and a length direction one side and width direction one side end portion of each of the cancel electrodes 30 are each electrically connected to a control device 32 (ECU, see FIG. 4) of the vehicle.

Insulating bodies 34 having an elongated substantially rectangular sheet shape and serving as an insulation section are provided between the respective sensor electrodes 24 and the cancel electrodes 30, with a length direction one side and width direction one side of the insulating body 34 facing in the same direction as a length direction one side and width direction one side of each of the respective sensors 22.

A layer shaped hot melt member 36 (see FIG. 5B) is formed as a coupling member on both the front-face side (the entire rim section 10B radial direction outside) and the back-face side (the rim section radial direction inside) of the insulating body 34, with the hot melt member 36 being configured by heating, melting, and then solidifying.

At the front-face side of the insulating body 34, after the sensor electrode 24 has been impregnated by the melted hot melt member 36, the hot melt member 36 is then solidified such that the sensor electrode 24 and the insulating body 34 are coupled together by the hot melt member 36. The first protrusions 28 of the sensor electrode 24 contact the front-face side of the insulating body 34, and through holes 36A are formed in the hot melt member 36 by the first protrusions 28. The hot melt member 36 thins to the extent at which the hot melt member 36 is not disposed at contact portions at intersection points between the first threads 24A and the second threads 24B of the sensor electrode 24.

At the back-face side of the insulating body 34, after the cancel electrode 30 has been impregnated by the melted hot melt member 36, the hot melt member 36 is then solidified such that the cancel electrode 30 and the insulating body 34 are coupled together by the hot melt member 36. The first protrusions 28 of the cancel electrodes 30 contact the back-face side of the insulating body 34 such that through holes 36A are formed in the hot melt member 36 by the first protrusions 28. The hot melt member 36 thins to the extent at which the hot melt member 36 is not disposed at contact portions at intersection points between the first threads 24A and the second threads 24B of the cancel electrodes 30.

The insulating body 34 is made from a resin, and the insulating body 34 electrically insulates the sensor electrode 24 from the cancel electrode 30. The insulating body 34 and the hot melt member 36 are elastically extensible in all directions, and the insulating body 34 and the hot melt member 36, together with the sensor electrode 24 and the cancel electrode 30, extend in the length direction when being assembled to the rim section 10B.

Leather 38 is provided over the entire outer periphery of the rim section 10B as an outer peripheral member configuring the detection mechanism 20, with the leather 38 covering the sensors 22 and configuring a front-face side (radial direction outside face) of the rim section 10B.

Next, explanation follows regarding operation of the present exemplary embodiment.

In the steering wheel 10 configured as described above, when an occupant grips the rim section 10B and a hand of the occupant contacts the front-face side of the leather 38 of the rim section 10B, an electrostatic capacitance generated between the hand of the occupant and the sensor electrode 24 of the sensors 22 is detected by the control device 32, and this is detected as the hand of the occupant gripping the rim section 10B (contacting the leather 38). The sensor electrode 24 and the cancel electrode 30 of the sensor 22 are controlled by the control device 32 to the same electrical potential. Any parasitic capacitance generated between the sensor electrode 24 and the rim core 12B is thereby limited by the cancel electrode 30, suppressing the electrostatic capacitance generated between the hands of the occupant and the sensor electrode 24 from being changed by such parasitic capacitance, and suppressing a fall in accuracy for detection of the occupant gripping the rim section 10B.

Moreover, each of the sensors 22 (the sensor electrode 24, the cancel electrode 30, the insulating body 34 and the pair of hot melt members 36) is extended in the length direction when the sensors 22 are being assembled to the rim section 10B (outer periphery of the inner member 18). The first threads 24A and the second threads 24B are accordingly tilted in opposite directions to each other in the sensor electrode 24 and the cancel electrode 30.

On the front-face side of the insulating body 34, the sensor electrode 24 contacts the insulating body 34 at the first protrusions 28 and the through holes 36A are formed in the hot melt member 36. On the back-face side of the insulating body 34, the cancel electrode 30 contacts the insulating body 34 at the first protrusions 28 and the through holes 36A are formed in the hot melt member 36. Thus even in cases in which the elasticity of the hot melt member 36 is relatively low compared to the elasticity of the insulating body 34, the hot melt members 36 can be extended easily and can be bent easily due to the through holes 36A, enabling a high extensibility in the length direction of the sensor 22 and a high bendability of the sensor 22 to be achieved. This enables the sensor 22 to be wound onto and assembled to the outer periphery of the inner member 18 easily.

Moreover, in both the sensor electrode 24 and the cancel electrode 30, the hot melt member 36 is not disposed at the contact portions at intersection points between the first threads 24A and the second threads 24B, and there is no coupling by the hot melt member 36 at the intersection points between the first threads 24A and the second threads 24B. This means that when the sensor electrode 24 and the cancel electrode 30 are extended in the length direction, the hot melt member 36 can be suppressed from limiting the relative tilting at the intersection points (contact portions) between the first threads 24A and the second thread 24B and from limiting length direction extension of the sensor electrode 24 and the cancel electrode 30, enabling a high extensibility to be achieved in the length direction of the sensor 22. This enables the sensor 22 to be wound onto and assembled to the outer periphery of the inner member 18 easily.

Second Exemplary Embodiment

Figure 6A:
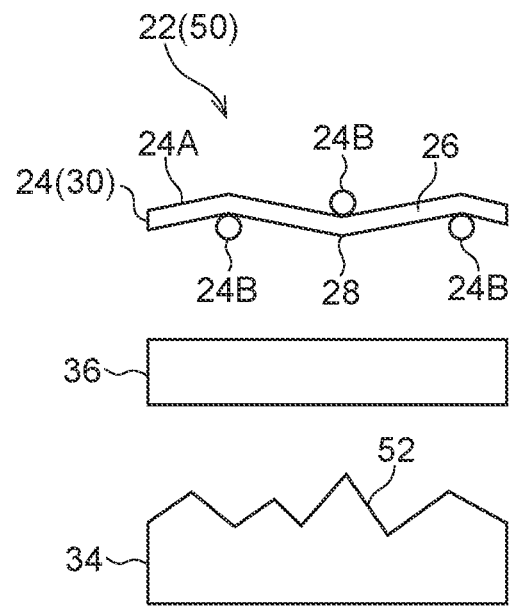
FIG. 6A is an enlarged cross-section illustrating a disassembled state of a sensor of a steering wheel according to a second exemplary embodiment of the present invention.
Figure 6B:
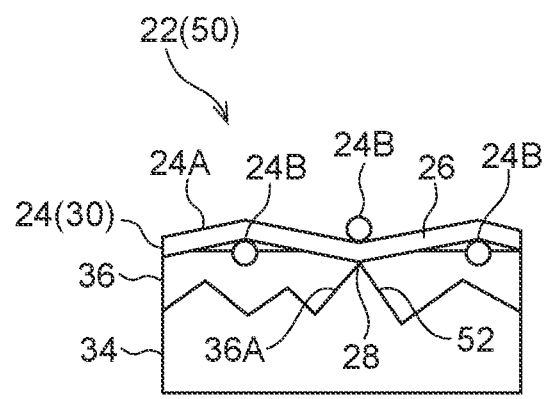
FIG. 6B is an enlarged cross-section illustrating a combined state of the sensor of the steering wheel according to the second exemplary embodiment of the present invention.

An enlarged cross-section of a sensor 22 of a steering wheel 50 serving as a contact body according to a second exemplary embodiment of the present invention is illustrated in FIG. 6A and FIG. 6B.

The steering wheel 50 according to the present exemplary embodiment has a substantially similar configuration to the first exemplary embodiment, but differs in the following points.

As illustrated in FIG. 6A and FIG. 6B, in the steering wheel 50 according to the present exemplary embodiment, an insulating body 34 of the sensor 22 is made, for example, from a foamed resin, and has a multitude of second protrusions 52 formed as protrusions on the front-face side and the back-face side of the insulating body 34 and having, for example, a triangular cross-section profile. The sizes of the second protrusions 52 are not uniform on either the front-face side or the back-face side of the insulating body 34.

The second protrusions 52 on the front-face side of the insulating body 34 project out toward the front-face side of the insulating body 34 (the sensor electrode 24 side) and make contact with the first protrusions 28 of the sensor electrode 24 such that through holes 36A are formed in the hot melt member 36 by the first protrusions 28 and the second protrusions 52. The second protrusions 52 on the back-face side of the insulating body 34 project out toward the back-face side of the insulating body 34 (the cancel electrode 30 side) and make contact with the first protrusions 28 of the cancel electrode 30 such that through holes 36A are formed in the hot melt member 36 by the first protrusions 28 and the second protrusions 52.

Similar operation and advantageous effects are exhibited in the present exemplary embodiment to those of the first exemplary embodiment.

In addition, the through holes 36A are formed in the hot melt member 36 by the first protrusions 28 of the sensor electrode 24 and the second protrusions 52 of the insulating body 34 projecting out and making contact at the front-face side of the insulating body 34. Moreover, the through holes 36A are formed in the hot melt member 36 by the first protrusions 28 of the cancel electrode 30 and the second protrusions 52 of the insulating body 34 projecting out and making contact at the back-face side of the insulating body 34. The first protrusions 28 and the second protrusions 52 are able to make appropriate contact at the front-face side and back-face side of the insulating body 34, enabling the through holes 36A to be formed appropriately in the hot melt member 36.

The first exemplary embodiment and the second exemplary embodiment have a configuration in which the hot melt member 36 is not disposed at the contact portions at intersection points between the first threads 24A and the second threads 24B for both the sensor electrode 24 and the cancel electrode 30. However, a configuration may be adopted in which the hot melt member 36 is disposed at the contact portions at intersection points between the first threads 24A and the second thread 24B for at least one of the sensor electrode 24 or the cancel electrode 30.

Furthermore, in the first exemplary embodiment and the second exemplary embodiment, the sensor electrode 24 and the cancel electrode 30 have a cloth form. However, a configuration may be adopted in which at least one of the sensor electrode 24 or the cancel electrode 30 has a metal sheet form, and in such cases, the first protrusions 28 may be formed to a surface on the insulating body 34 side of at least one of the sensor electrode 24 or the cancel electrode 30.

Moreover, in the sensor 22 of the first exemplary embodiment and the second exemplary embodiment, the cancel electrode 30 and the hot melt member 36 are provided at the back-face side of the insulating body 34. However, in the sensor 22, the cancel electrode 30 and the hot melt member 36 may be omitted from the back-face side of the insulating body 34. Adopting this approach enables the extensibility in the length direction of the sensor 22 and the bendability of the sensor 22 to be raised even further, enabling the sensor 22 to be wound onto and assembled to the outer periphery of the inner member 18 even more easily, and enabling reductions in cost of the sensor 22. In such cases, the cancel electrode 30 may be provided at the outer periphery of the inner member 18.

In the first exemplary embodiment and the second exemplary embodiment, the sensor 22 is provided at the steering wheel 10, 50 (contact body). However, the sensor 22 may be provided at a contact body (for example, a vehicle seat) other than the steering wheel 10, 50.

What is claimed is:

1. A detection mechanism comprising:
   a detection section provided at a contact body and configured to detect contact of a person with the contact body;
   a conducting body provided at the detection section;
   an insulating body provided at the detection section;
   a coupling member provided at the detection section between the conducting body and the insulating body and solidified so as to couple the conducting body and the insulating body together; and
   a protrusion provided at at least one of the conducting body or the insulating body, the conducting body and the insulating body making contact at an installation position of the protrusion so as to form a through hole in the coupling member.

2. The detection mechanism of claim 1, wherein a protrusion provided at the conducting body and a protrusion provided at the insulating body make contact with each other.

3. The detection mechanism of claim 1, wherein the conducting body is provided at the detection section only on one side of the insulating body.

4. The detection mechanism of claim 1, wherein the conducting body has a cloth form woven from a first thread and a second thread.

5. The detection mechanism of claim 1, wherein the insulating body is made from a foamed resin.

6. The detection mechanism of claim 1, wherein the detection section is bendable.

7. A detection mechanism comprising:
- a detection section provided at a contact body and configured to detect contact of a person with the contact body;
- a conducting body provided at the detection section and having a cloth form woven from a first thread and a second thread;
- an insulating body provided at the detection section; and
- a coupling member provided at the detection section between the conducting body and the insulating body, solidified so as to couple the conducting body and the insulating body together, and not provided at a contact portion between the first thread and the second thread.

8. The detection mechanism of claim 7, wherein the conducting body is provided at the detection section only on one side of the insulating body.

9. The detection mechanism of claim 7, wherein the insulating body is made from a foamed resin.

10. The detection mechanism of claim 7, wherein the detection section is bendable.

\* \* \* \* \*